US008862424B2

(12) United States Patent
Johnson et al.

(10) Patent No.: US 8,862,424 B2
(45) Date of Patent: *Oct. 14, 2014

(54) INTEGRATED CROSS-TESTER ANALYSIS AND REAL-TIME ADAPTIVE TEST

(75) Inventors: Mark C. Johnson, South Burlington, VT (US); Deepak S. Turaga, Elmsford, NY (US); Olivier Verscheure, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/603,892

(22) Filed: Sep. 5, 2012

(65) Prior Publication Data

US 2012/0330593 A1    Dec. 27, 2012

Related U.S. Application Data

(63) Continuation of application No. 12/871,429, filed on Aug. 30, 2010.

(51) Int. Cl.
| | | |
|---|---|---|
| *G01D 3/00* | (2006.01) | |
| *G01P 21/00* | (2006.01) | |
| *G01R 31/28* | (2006.01) | |
| *G01R 31/319* | (2006.01) | |

(52) U.S. Cl.
CPC ........ *G01R 31/2894* (2013.01); *G01R 31/3191* (2013.01)
USPC ..................... 702/108; 324/762.01

(58) Field of Classification Search
CPC ................................. G01R 31/31901
USPC ..................... 702/108; 324/762.01
See application file for complete search history.

(56) References Cited

U.S. PATENT DOCUMENTS

| | | |
|---|---|---|
| 5,442,562 A | 8/1995 | Hopkins et al. |
| 6,138,249 A | 10/2000 | Nolet |
| 6,167,545 A | 12/2000 | Statovici et al. |
| 6,367,041 B1 | 4/2002 | Statovici et al. |
| 6,442,445 B1 | 8/2002 | Bunkofske et al. |

(Continued)

OTHER PUBLICATIONS

Lee, et al., "RTSPC: A Software Utility for Real-Time SPC and Tool Data Analysis", IEEE Transaction on Semiconductor Manufacturing, Feb. 1995.

Skinner, et al., "Multivariate Statistical Methods for Modeling and Analysis of Wafer Probe Test Data", IEEE Transaction on Semiconductor Manufacturing, Nov. 2002, vol. 15, No. 4, pp. 523-530.

(Continued)

*Primary Examiner* — Jonathan C Teixeira Moffat
*Assistant Examiner* — Regis Betsch
(74) *Attorney, Agent, or Firm* — Scully, Scott, Murphy & Presser, P.C.; William Stock, Esq.

(57) ABSTRACT

Processing test results from a plurality of individual semiconductor testers by analyzing each test result at an adaptive test engine. A centralized system jointly analyzes all the test results from the plurality of individual semiconductor testers. The adaptive test engine or the centralized system identifies, based on the analysis of each test result or the joint analysis of all the test results, one or more of: a test environmental issue, a tester variability issue, a tester calibration issue, a product variability issue, and a manufacturing process variability issue. The adaptive test engine or the centralized system determines whether one or more of the plurality of individual semiconductor testers causes one or more of the identified issues or whether semiconductor products tested by the plurality of individual semiconductor testers causes one or more of the identified issues.

14 Claims, 8 Drawing Sheets

(56) References Cited

U.S. PATENT DOCUMENTS

| | | |
|---|---|---|
| 6,549,864 B1 | 4/2003 | Potyrailo |
| 6,584,368 B2 | 6/2003 | Bunkofske et al. |
| 6,618,682 B2 | 9/2003 | Bulaga et al. |
| 6,678,569 B2 | 1/2004 | Bunkofske et al. |
| 6,711,514 B1 | 3/2004 | Bibbee |
| 6,792,373 B2 | 9/2004 | Tabor |
| 7,248,939 B1 | 7/2007 | Chamness et al. |
| 2009/0012737 A1* | 1/2009 | Coss et al. .................. 702/108 |

OTHER PUBLICATIONS

"System S—Stream Computing at IBM Research", IBM®, IBM Corporation, Oct. 1, 2008, http://www-01.ibm.com/software/sw-library/en_US/detail/R924335M43279V91.html.

Aspen Technology, Inc., "Aspen InfoPlus.21 Family," 2009, http://www.aspentech.com/brochures/Aspen_InfoPlus21_T3_bro_final.pdf.

* cited by examiner

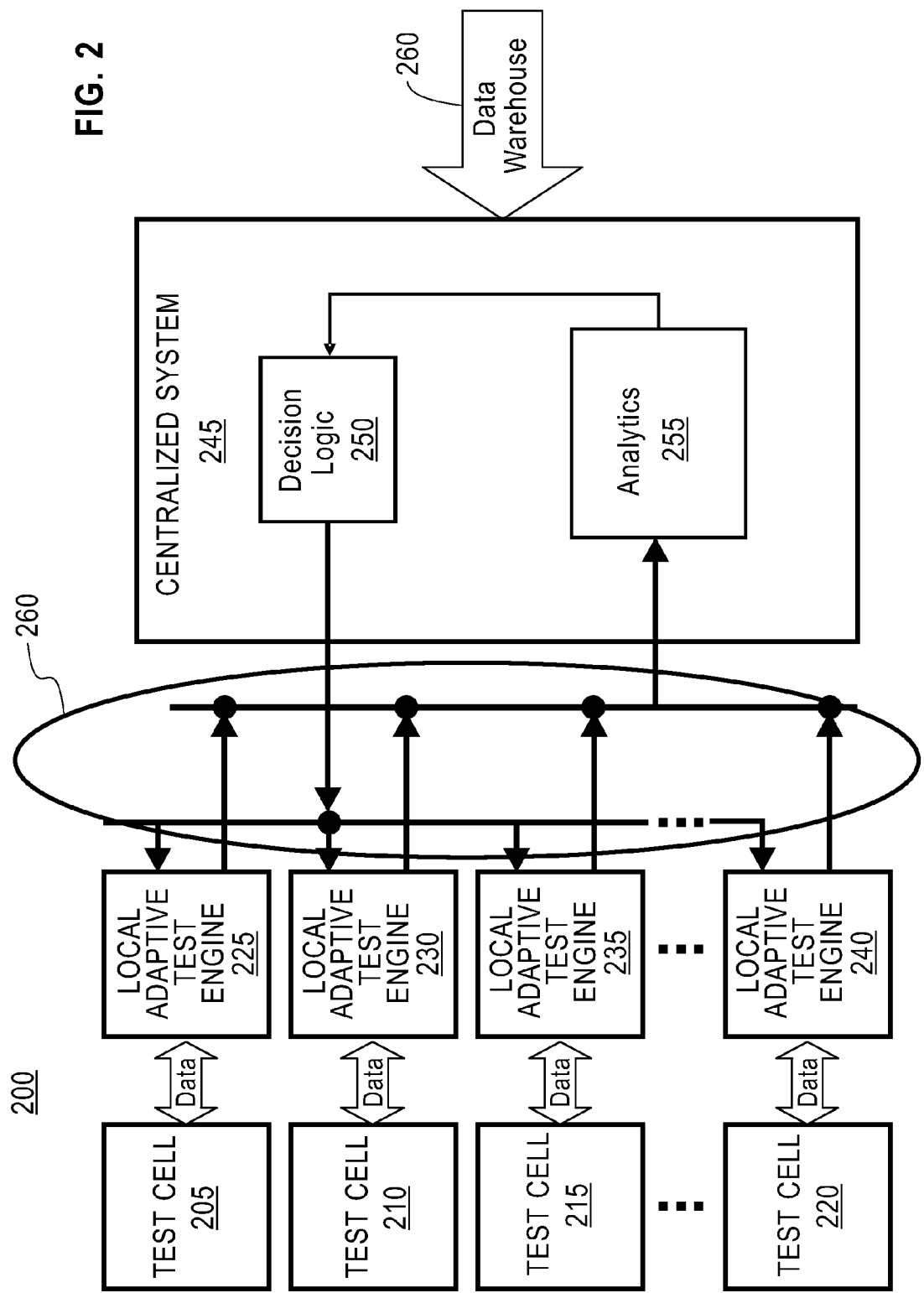

_US 8,862,424 B2_

INTEGRATED CROSS-TESTER ANALYSIS AND REAL-TIME ADAPTIVE TEST

CROSS REFERENCE TO RELATED APPLICATION

This application is a continuation of U.S. patent application Ser. No. 12/871,429, filed Aug. 30, 2010, the entire content and disclosure of which is incorporated herein by reference.

BACKGROUND

The present invention generally relates to testing at least one semiconductor product. More particularly, the present invention relates to analyzing test results of at least one semiconductor product.

A semiconductor product includes, but is not limited to a semiconductor chip, a semiconductor wafer and a semiconductor wafer lot. An individual semiconductor tester includes, but is not limited to an Automatic Test Equipment (ATE) station. An ATE station refers to any automated device that is used to test printed circuit boards, semiconductor wafers, semiconductor chips, integrated circuits (ICs) or any other electronic components. Agilent® Medalist i1000D, Agilent® Medalist i3070, Teradyne® Catalyst, Teradyne® Tiger, Teradyne® FLEX and Teradyne® UltraFLEX are examples of commercially available ATE stations.

An ATE station requires an active monitoring to ensure that the tester (ATE station) and/or a test program (i.e., a software program directing the tester) are operating under proper conditions. These conditions involve appropriate control of mechanical, physical, electrical, programmatic and environmental aspects. Some examples of these conditions include a proper calibration of the tester, probe instrument cleanliness and alignment, proper test limits and test parameters applied during the testing, and proper environment temperature settings. The probe instrument is part of the device interface board (DIB) that is used to connect the semiconductor device under test (DUT) to the tester. For example, a tester's pin parametric measuring units need the probes to be in proper condition to properly measure electrical characteristics. Control and monitoring problems encountered in the testing lead to wasted resources including, but not limited to: a semiconductor product loss, an increased test time, increased labor hours (i.e., increased labor cost), overly stressed equipment, augmented schedules, improperly tested devices, and increased cost.

Therefore, it is highly desirable that the testing is properly operated, monitored, and controlled either manually by operators or automatically using systems for Statistical Process Control (SPC) and Adaptive Test.

SUMMARY OF THE INVENTION

The present invention describes a system and computer program product for processing test results from a plurality of individual semiconductor testers to properly operate, monitor and control the testers by using the SPC and Adaptive Test.

In one embodiment, there is provided a computer-implemented system for processing test results from a plurality of individual semiconductor testers for testing a semiconductor product. The system receives the test results from the plurality of individual semiconductor testers. At least one local adaptive test engines analyzes each test result at a local adaptive test engine corresponding to an individual semiconductor tester. A centralized system jointly analyzes a plurality of the test results from the plurality of individual semiconductor testers. The local adaptive test engine and/or the centralized system identifies, based on the analysis of each test result or the joint analysis of all the test results, one or more of: a test environmental issue, a tester variability issue, a tester calibration issue, a product variability issue, and a manufacturing process variability issue. The centralized system and/or local adaptive test engine determines a cause of the one or more of the identified issues.

In a further embodiment, the test environmental issue is one or more of: a hardware issue, an electrical issue, a mechanical issue and a maintenance issue.

In a further embodiment, the system determines the cause by comparing the test results of the semiconductor product tested across the individual semiconductor testers.

In a further embodiment, the system changes a testing schedule of the semiconductor products on said each individual semiconductor tester according to the determined cause.

BRIEF DESCRIPTION OF THE DRAWINGS

The accompanying drawings are included to provide a further understanding of the present invention, and are incorporated in and constitute a part of this specification. The drawings illustrate embodiments of the invention and, together with the description, serve to explain the principles of the invention. In the drawings.

FIG. 2 illustrates another testing environment according to one embodiment of the present invention.

DETAILED DESCRIPTION

Figure 1:
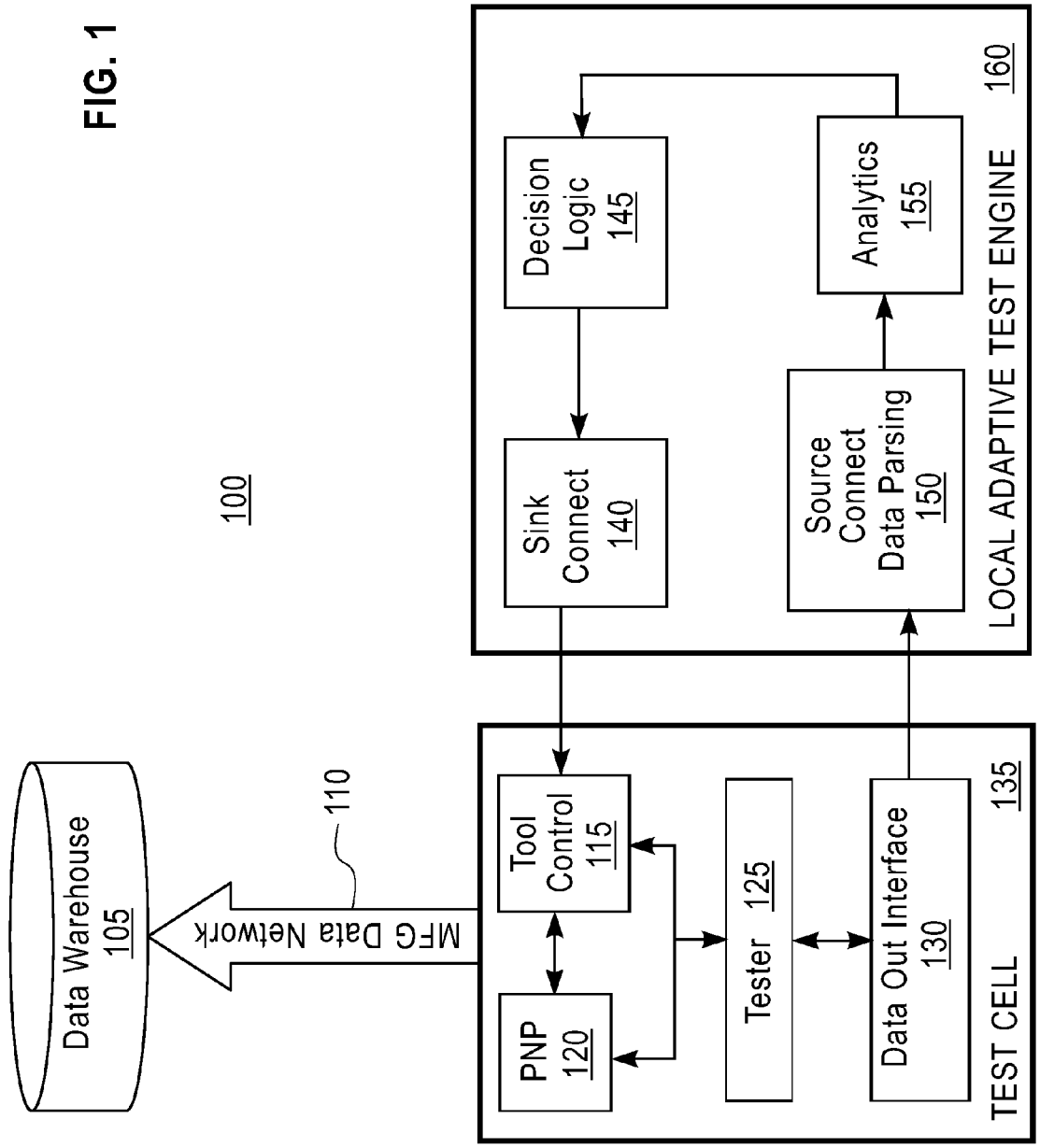
FIG. 1 illustrates a testing environment according to one embodiment of the present invention.

The SPC refers to using statistical methods to measure and analyze variations in processes (e.g., a testing process or a manufacturing process). The SPC involves real-time monitoring and analysis of a testing to detect outliers and anomalies and to build statistical models for a predictive control of the testing. The predictive control refers to computing future behaviors according to a model of data (e.g., test results). Aspen Real-Time Statistical Process Control Analyzer is one type of commercially available product performing the SPC. Sherry F. Lee, et al., "RTSPC: A Software Utility for Real-Time SPC and Tool Data Analysis", IEEE Transaction on Semiconductor Manufacturing, February 1995, wholly incorporated by reference as if set forth herein, also describes software performing the SPC in real-time. The Adaptive Test refers to a methodology for adapting a tester to characteristics of a product under the testing based on real-time test results and modeling of historical data (e.g., past test results). The Adaptive Test involves a dynamic adaptation of the testing in order to minimize time to detect faults, save test time, and improve product quality and yield. Methods for the Adaptive Test include, but not limited to: a test flow sequence manipulation, a test control limit adaptation, and using statistics to dispose (i.e., prepare) the product appropriately. Mihai G. Satovici, et al. "Self-Adaptive Test Program", U.S. Pat. No. 6,167,545, wholly incorporated by reference as if set forth herein, describes software performing the Adaptive Test.

The test flow sequence manipulation can be achieved in ways such as removing tests from a test flow based on fail statistics, a test pattern reduction (i.e., removing (testing) patterns based on fail statistics, a test pattern redundancy, or a testing cost), adaptive test scheduling (i.e., changing an order in which tests are applied based on the fail statistics and predictive control), and adding additional tests for a characterization of semiconductor products being tested or for further testing the semiconductor products that have electrical properties that could indicate reliabilities of the semiconductor products.

Test control limit adaptation refers to adjusting control values (i.e., parameter values used for controlling of testers) based on current data (i.e., test results that are obtained from testers in real-time). The control values are usually parametric measurements (i.e., outputs obtained from specific pins of the testers or ATEs via PPMUs (Pin Parametric Measurement Units) as a result of applying some electrical signal inputs into semiconductor products under a test) and can vary from a wafer to a wafer and from a wafer region to a wafer region. Test limits (i.e., thresholds that are considered while conducting the test) may also be adapted to the semiconductor products under the test as long as the test limits do not violate customer specifications.

Sorting, binning, and dispositioning are processes of specifying a condition of the individual semiconductor chip tested. Dispositioning is a process of specifying a condition of a semiconductor wafer, wafer lot (i.e., a set of wafers), or module lot (i.e., a set of modules) and may affect how a wafer or wafer lot proceeds in a semiconductor manufacturing process. A disposition result may be obtained during a test or during a post test analysis by applying a set of algorithms (e.g., SPC and/or Adaptive Test) and rules to any pertinent data associated with the semiconductor product under test, such as raw test data, sorts, and manufacturing data. Post test statistical analysis may result in a change of any individual semiconductor chip's sort/bin defined during test (e.g. the statistical analysis finds irregularities in a semiconductor chip's data and its test result bin is changed from "pass" to "fail"). Disposition results determine follow-on actions including, but not limited to: fail a chip, hold a wafer, retest a wafer, hold a wafer or module lot, or move a wafer or module lot to a next operation. Semiconductor products put on a hold for a further review may eventually be scrapped (discarded).

The Adaptive Test may further involve an adaptation (i.e., adapting a tester to characteristics of a product under the test) at different time granularities (e.g. milliseconds per a semiconductor chip for an adaptation versus hours/days for an adaptation across a semiconductor wafer, etc.). Both the SPC and the Adaptive Test include a feedforward and feedback control for monitoring, analyzing and/or modifying a test.

According to one embodiment of the present invention, a computing system (e.g., a computing system 700 in FIG. 7) performs an integrated analysis of the parametric measurements and the test results from multiple testers to dynamically drive the Adaptive Test in real-time. The computing system 700 receives a data stream including test results from a plurality of testers in the same or different locations, performs statistical analyses on the data stream, and feeds back results of the analyses to the testers to run the Adaptive Test. The receiving, performing and feeding are done in real-time.

A test floor includes a plurality of testers testing semiconductor products (e.g., semiconductor wafers and semiconductor chips) in parallel. These testers may be distributed in multiple locations and may have different environmental and physical conditions (e.g., different temperatures). There are several characteristics of tests (i.e., tests done by the testers) that are similar across the testers depending on types of the products under the tests. The computing system 700 analyzes test results from the plurality of testers jointly to identify a test environmental issue, a tester variability issue, a tester calibration issue, a product variability issue and a manufacturing process variability issue, etc. These issues are described in detail below. Furthermore, the computing system 700 uses results of the analysis to run the Adaptive Test on each individual tester.

FIG. 1 illustrates a test floor according to one embodiment of the present invention. The test floor 100 includes, but not limited to: at least one test cell 135, at least one local adaptive test engine 160 and a network 110 to connect to at least one data warehouse 105. The data warehouse 105 may be implemented as a storage device (e.g., a disk or tape, etc.) or a database (e.g., IBM® DB2®, etc.). The tester cell 135 includes, but not limited to: a tester 125, tester software 120, a tool control unit 115, and a communication interface 130. The test cell 135 communicates with the data warehouse, e.g., by storing test results to the data warehouse 105, through a network connection 110 (e.g., DSL, T1, Cable, Internet, Intranet, etc.). The tester 125 (e.g., ATE station) is a machine conducting one or more tests on the semiconductor products. The tester 125 performs a plurality of tests including, but not limited to: logical (behavioral) tests, performance tests, open/short circuit tests, structural tests, thermal tests (e.g., a test for a thermal diode in a semiconductor chip), etc. The tool control unit 115 is an interface (e.g., API (Application Programming Interface)) of the tester. The tool control unit 15 also interacts with the local adaptive test engine 160 which is described in detail below. The tester software 120, in one embodiment, implements PNP (Part Number Program; i.e., software program that directs or operates the tester). The PNP communicates with the tester 125 to specify how and when particular tests should be performed. The tool control unit 115 also interacts with the tester software 120 and/or the tester 125 to pause, make changes on, or terminate the tests. A communication interface 130 may be a part of the tool control unit 115 but does not necessarily need to be (e.g., tester platform may have a built-in data streaming protocol). The test results may be provided from the tester 125 to the local adaptive test engine 160 through the communication interface 130. Katina R. Skinner, et al., "Multivariate Statistical Methods for Modeling and Analysis of Wafer Probe Test Data", IEEE Transaction on Semiconductor Manufacturing, Vol. 15, No. 4, November 2002, wholly incorporated by reference as if set forth herein, describes performing statistical analyses (e.g., regression and classification) on wafer probe test data.

The local adaptive test engine 160 includes, but is not limited to: the source connect data parsing unit 150, an analytics unit 155, a decision logic unit 145 and a sink connect unit 140. The source connection data parsing unit 150 receives, parses and formats data (i.e., test results from the test cell 135) for various statistical analyses, which may be industry standards. The analytics unit 155 performs the statistical analyses on the test results. The statistical analyses includes, but is not limited to: mutual information over time, descriptive statistics, causal models, classification and regression trees, cost sensitive learning, ridge, lasso, elastic net, correlation coefficient, hypothesis tests including Student's "T test" (i.e., a test assessing whether the means of two groups are statistically different each other), predictive tracking filters (e.g., Kalman Filters), Correlations, and Time Series Clustering.

The mutual information refers to an information theory measuring a relationship between two different distributions. Descriptive statistics or hypothesis testing refers statistical characterizations or tests to detect differences in data distributions, including tests for differences in means. A causal model includes an Engle-Granger regression method, which is an approach selecting an arbitrary normalization and regressing a variable over others. Classification and regression trees include a binary space partitioning methods, which recursively performs hierarchical partitioning or subdivision of a n-dimensional space into subspaces. Cost sensitive learning addresses prediction tasks for which penalties associated with prediction errors depend on a nature of the errors. Ridge, lasso and elastic network is a linear modeling technique that allows rapid evaluation and inclusion of large numbers (e.g., thousands or millions) of correlated variables. Kalman filter is a recursive filter that estimates a state of a linear system forming a series of noise measurements. Correlations represent a strength or direction of a linear relationship between two random variables. Time Series Clustering refers to classifying or grouping a times series (i.e., a sequence of data measured at successive and uniform time intervals).

Once the analytics unit 155 completes one more of the statistical analyses, the analytics unit 155 provides results of the analyses, called summary statistics, to the decision logic unit 145. Upon receiving the summary statistics, the decision logic unit 145 determines what action should be taken under the test results. The action to be taken includes, but is not limited to: changing a testing schedule (i.e., a sequence of tests) on the testers, changing hardware or software in one or more testers, shutting down one or more testers, stopping one or more tests, and changing test limits on one or more tests. The action to be taken is provided from the decision logic 145 as control instructions or commands to the tool control unit 115 through the sink connection unit 140 which is an interface (e.g., API) of the local adaptive test engine 160, e.g., by utilizing an electronic messaging method (e.g., an email, instant messaging, electronic alert, packet messaging, etc.). Then, the tester 125 performs the action. The decision logic unit 145 may also initiate its own actions such as changing or modifying tests, changing control limits, or sending alerts, etc.

FIG. 2 illustrates another test floor according to one embodiment of the present invention. The test floor 200 includes a plurality of test cells 205-220, a plurality of local adaptive test engines 225-240 interconnected via a communication network 260 to a centralized system 245. In this embodiment, a test cell exchanges data (e.g., test results or summary statistics) with a local adaptive test engine. In the embodiment, the number of test cells may be same as the number of local adaptive test engines. A test cell is associated with at least one local adaptive test engine. FIG. 2 illustrates how the local adaptive test engine depicted in FIG. 1 is expanded to joint analyses. The joint analyses evaluate whether there are specific issues (e.g., a test environmental issue, a tester variability issue, etc.) on a specific tester when it is compared to other testers. The joint analyses synthesize and/or correlate test results from the plurality of testers 205-220 and then make a decision about actions to be taken in the testers 205-220. For example, the joint analyses compare a single product's test results (for multiple wafers) across multiple testers using multiple interface hardware configurations.

Instead of limiting actions at the local adaptive test engines 225-240, the centralized system 245 obtains test results from all the test cells 205-220, and integrates and analyzes these test results to identify irregularities on the test floor 200 and/or to understand anomalies in the semiconductor products tested in the test cells 205-220. In this embodiment, the analytic module 255 in the centralized system 245 performs the statistical analyses on the integrated test results. Based on results of the statistical analyses, the decision logic module 250 in the centralized system 245 determines one or more actions. These actions may be specific to a particular test cell and/or local adaptive test engine. Alternatively, these actions are applied to all the test cells 205-220 and/or local adaptive engines 225-240. Examples of these actions are described above. The centralized system 245 communicates with one or more of the test cells 205-220 and/or one or more of the local adaptive test engines 225-240 through the communication network 260 (e.g., Internet, Wi-Fi, Intranet, LAN, WAN, wireless-LAN, satellite communication, etc.).

The centralized system 245 applies the determined actions to one or more of the local adaptive test engines 225-240 in real-time. The centralized system 245 also applies the determined actions to one or more of the test cells 205-220 in real-time. The centralized system 245 may store the determined actions as history data to the data warehouse 105 for future purpose (e.g., future tests). The application of the determined action to the one or more of test cells 205-220 may cause a change in a testing schedule of the semiconductor products being tested or to be tested on the test cells 205-220.

In another embodiment, the local adaptive test engines 225-240 analyze data streams including the test results from the test cells 205-220, e.g., by running at least one local analytic algorithm (e.g., Time Series Clustering described above) specific to a particular test cell. The at least one algorithm performs statistical analyses on the data streams in conjunction with historical data (e.g., the number of semiconductor products tested, trace data (i.e., data obtained during manufacturing from manufacturing tools)) obtained from a data warehouse 260 to identify an optimal schedule of tests. A commonly assigned application, Johnson et al, "Optimal test flow scheduling within automated test equipment for minimized mean time to detect failure", U.S. Pat. No. 12/784,142, wholly incorporated by reference as if fully set forth herein, describes the identifying the optimal test schedule of tests in detail. After these local adaptive test engines 225-240 complete the statistical analyses on the data streams, the centralized system 245 also analyzes the data streams jointly through a set of analytic algorithms (e.g., the Kalman filter, the Student's T test, etc.) to identify one or more of: the test environmental issue, the tester variability issue, the tester calibration issue, the product liability issue and the manufacturing process variability issue. These issues and how to identify these issues are described in detail below.

Then, the centralized system 245 determines a cause(s) of these issues, e.g., by comparing test results from a same semiconductor product across the test cells 205-220. This comparison leads to the determination of whether a particular test cell causes one or more of these issues or whether the particular semiconductor product causes one or more of these issues. Thus, the centralized system 245 can determine whether one or more of the test cells 205-220 cause one or more of these issues and/or whether a particular semiconductor product tested by the one or more of test cells causes one or more of these issues. For example, if a plurality of test cells shows a particular issue, then the centralized system 245 decides that the particular semiconductor product tested by the test cells causes the particular issue. If only a particular test cell shows a certain issue, then the centralized system 245 decides that the particular test cell causes the certain issue.

Figure 7:
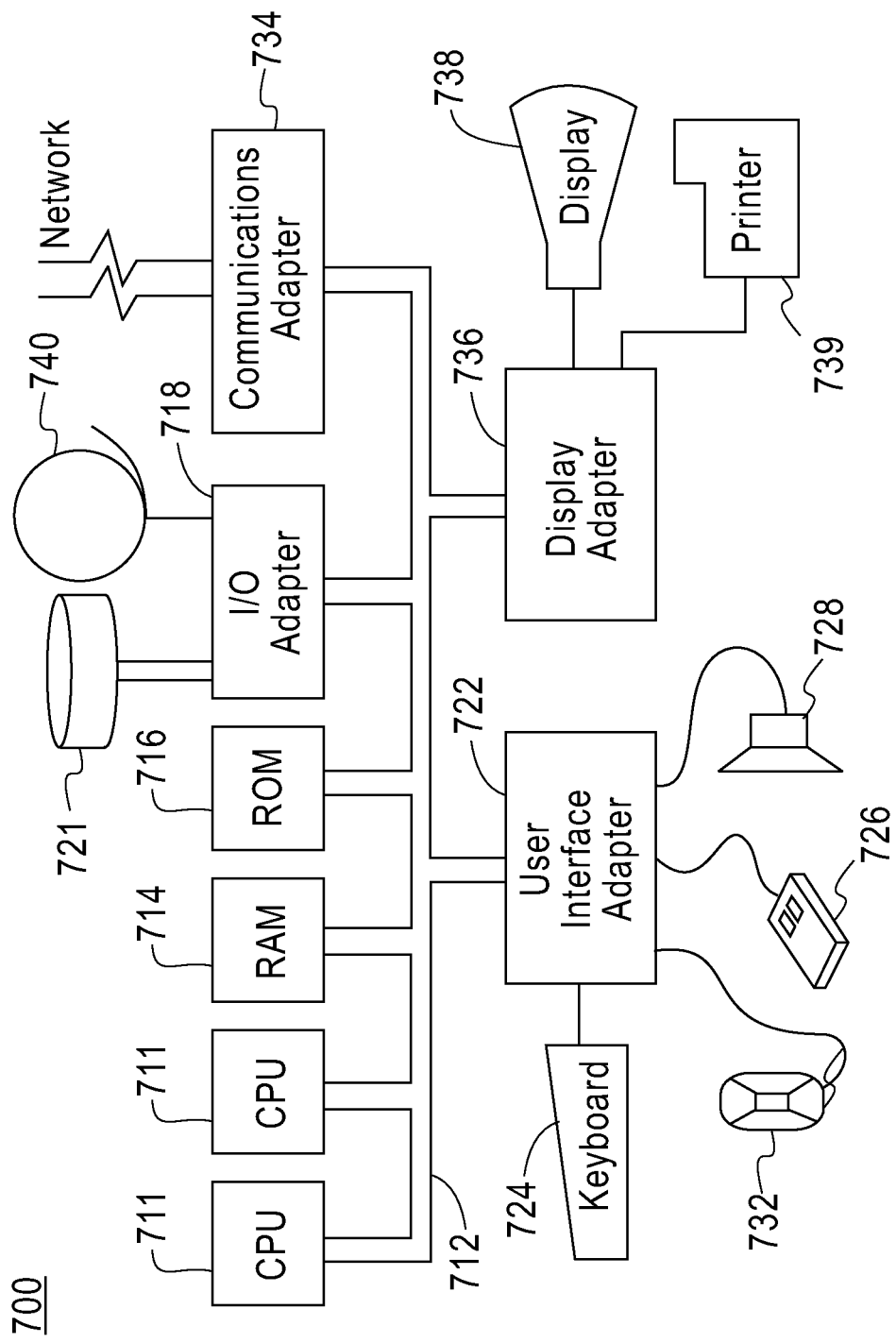
FIG. 7 illustrates an exemplary hardware configuration for implementing the flow chart depicted in FIG. 3 according to one embodiment of the present invention.

In one embodiment, the centralized system is implemented as a computing system (e.g., a computing system 700 in FIG. 7). In an alternative embodiment, the centralized system is implemented as a distributed computing system (i.e., multiple computers that communicate through a network).

The test environmental issue includes, but not limited to: a hardware issue, an electrical issue, a mechanical issue and a maintenance issue. The hardware issue is detectable, e.g., by performing the analyses in the local adaptive test engines 225-240 and/or the joint analyses (e.g., integrating or compiling test results from a same semiconductor product across the test cells 205-220 and then performing statistical analyses the integrated or compiled the test results) in the centralized system 245. For example, consider that test hardware is interchangeable for any given product. In this example, transformers and/or probe head are interchangeable between testers. A transformer converts and directs tester channels (e.g., power sources, test pins, control pins, etc.) to appropriate probe pins that are contacted to correct product pins (e.g., correct pins on a semiconductor chip or module). The probe pins are grouped in a probe card or probe head. Each semiconductor product has multiple or many copies of the transformer and probe head and they are all designed to be interchangeable, such that there can be many combinations of a tester, a transformer and a probe card that need to be examined for possible hardware issues. Because these three hardware components (the tester, the transformer and the probe head) can be mixed or interchanged, the centralized system 245 performs the joint analyses to identify which combinations of these hardware components lead to the worst test result(s) and then further identify which hardware component is common to these combinations. The centralized system 245 may recommend what combinations to use. The joint analyses also identify a specific pin failure on a semiconductor product that has been tested by the test cells 205-220 each of which may conduct each different or same test. The test conducted by the test cells 205-220 includes, but not limited to: measuring leakage current, inspecting open and/or short circuits, measuring speed of the semiconductor product, measuring power consumption of the semiconductor product, etc.

The centralized system 245 or one or more of the local adaptive test engines 225-240 identifies the electrical issues including, but not limited to: unstable power supplies and temperature control units, e.g., by analyzing electrical parameters (e.g., voltages, thermal resistance, etc.) through a scan, a core test, a performance sort ring oscillator (PSRO), a logic test that captures at least one clock signal on the semiconductor product that is currently or already tested or other tests that measure a current drain, voltage drain or power drain on the power supplies. The scan is a process of loading the semiconductor product with data as synchronized with a clock signal. The core test evaluates a functional logic (e.g., PLL (Phase Locked Loop) or DLL (Delayed Locked Loop) of the semiconductor product. The PSRO includes electric circuits designed based on a physical technology (e.g., CMOS 45 nm technology) of the semiconductor product. These electric circuits in the PSRO count oscillation cycles of a signal (e.g., a clock signal) to determine a speed of the signal in a particular area. These electric circuits may be spread throughout the semiconductor product.

The centralized system 245 or one or more of the local adaptive test engines 225-240 identifies the mechanical issue (e.g., an unstable compressor) by testing a physical module (e.g., the semiconductor module) or performing a wafer test (i.e., testing all individual integrated circuits presented on the wafer to detect functional defects by applying test patterns to the circuits). The mechanical issue results in an improper or unbalanced contact between the probe pins and semiconductor chip pads. The mechanical issue can also damage the probe pins causing the electrical issues as further tests pass.

The centralized system 245 or one or more of the local adaptive test engines 225-240 also identify the maintenance issue (e.g., a lack of coolant in a cooling system). The coolant keeps the test floor (e.g., test floor 100 or 200) at a specific temperature and also keeps a semiconductor product under a test at a specific temperature. When the coolant runs low, a large number of semiconductor products elevate their temperatures. However, a manufacturing process variation (e.g., process or temperature variation in polysilicon deposited in the semiconductor product) in a FAB can also cause the temperature elevation in the semiconductor product. Therefore, the centralized system 245 verifies whether the temperature elevation is due to the semiconductor itself or due to the testers, e.g., by performing the joint analyses.

The tester calibration issue includes, but not limited to: a skew in pin signal delays from a DUT (Device under test) to a tester and vice versa. A length of each path from a tester electronic to a semiconductor chip pin varies based on wiring in the tester and a device interface board (DIB including at least one transformer and probe head). Signal propagation delays for each path are measured and then compensated for within the tester electronic to insure timing on all the signals to and from the DUT arrive precisely relative to each other. Therefore, it is possible for tests, specifically high speed tests, to fail if any given clock pin or data pin has not been calibrated for an excessive delay path. The centralized system 254 or one or more of the local adaptive test engines 225-240 may detect that a tester is showing a large number high speed logical fails, while the contact, PSRO, and PLL measurements are fine. Therefore, the centralized system 245 may determine a tester needs to be calibrated for pin signal propagation delay.

A tester software issue includes, but not limited to: corrupted or incorrect PNPs (Part Number Programs) in one or more testers. The centralized system 245 or one or more of the local adaptive test engines 225-240 monitors Part Number Programs (PNPs) loaded on each tester. Incorrect or corrupted PNPs may be loaded on a tester. In a traditional system, PNP issues may not be detected until a large number (e.g., a million) of semiconductor products have been tested. According to one embodiment of the present invention, the centralized system 245 performs the joint analyses on a list of tests and test limits that are being used across the test floor to determine if a tester is running what is expected.

The centralized system 245 or one or more of the local adaptive test engines 225-240 determines variability (e.g., uneven qualities) in semiconductor products being tested or already tested across the test cells 205-220, e.g., by predictive modeling, the correlation or a transfer of learning. The predictive modeling is a process by which a model is created or chosen to try to predict a probability of an outcome. The transfer of learning refers to an application of skills, knowledge or experiences that gained in one situation to another situation. A user (e.g., an engineer) may use the determined variability for a semiconductor technology transition (e.g., moving from CMOS 65 nm technology to CMOS 45 nm technology) within a same semiconductor product family. For example, assume that a user currently uses 65 nm technology and plans to bring up 45 nm technology. Further assume that machine used for manufacturing semiconductor products under 45 nm technology is being tested with identical test programs but requires some adjustments with parametric limits. These parametric limits are test, control or specification limits or other trigger limits established by at least one engineer. The limits refer to thresholds, maximum values or minimum values that are given numerical values. In this example, the joint analyses can be used adaptively and test specifications (e.g., documents that describe how to implement test(s)) can be defined based on differences in test results of the two technologies. The centralized system 245 can also concurrently analyze test results from diverse semiconductor products, even if these diverse semiconductor products use a same semiconductor technology, to evaluate electrical properties of these diverse products to determine if common semiconductor material used in these diverse products is behaving correctly, e.g., by running a stream computing middleware on the centralized system 245.

By processing test results from the test cells 205-220, the centralized system 245 detects manufacturing process variability issues. The centralized system 245 detects these process variability issues and indentify underlying root causes of the process variability, e.g., by correlating the test results with data streams from inline tests. The data streams from inline tests refer to test data obtained semiconductor manufacturing stages/processes and/or trace data from semiconductor manufacturing tools and the summary statistics. The centralized system 245 can also detect these process variability issues, e.g., by tracking the statistic summaries or running a change detection algorithm. The change detection algorithm refers to a statistical analysis algorithm that identifies a change or anomaly in a process or distribution. The change algorithm may filter out anomalies that are random and identify anomalies that have a systematic nature (e.g., anomalies related to semiconductor testing tools).

Diverse variations of applications and architecture of FIGS. 1-2 can be made. These variations include, but not limited to:

(1) Testing programs (e.g., PNPs) are distributed across the test cells 205-220 each including at least one tester and/or computing devices (e.g., the computing system 700) at plurality of locations.

(2) The centralized system 245 or the local adaptive test engines 225-240 detects, at least, unstable power supplies and temperature control units, e.g., by performing statistical analyses or the joint analyses. The unstable power supplies and temperature control units can also be identified by the scan, the core test, the PSRO or other tests detecting a current drain, voltage drain or power drain on the power supply or requiring signal stability, i.e., a signal needs be launched and captured according to a defined clocking scheme. The centralized system 245 or the local adaptive test engine 225-240 also detects that cooling systems run out of coolant before an engineer notices, e.g., by measuring temperatures of semiconductor products through thermal diodes or resistors.

(3) The joint analyses can be hierarchically organized, e.g., analyses are aggregated or distributed in stages based on different criteria such as product similarities, tester similarities, geographical distances between testers, etc.

(4) One or more of the local adaptive test engines 225-240 feeds forward its results of statistical analyses upon finding something interesting (e.g., the test environmental issue, the tester variability issue, the tester calibration issue, the product variability issue, the manufacturing process variability issue, etc.). If something interesting is detected in the one or more of the local adaptive test engines 225-240, then an engineer may run the joint analyses using the centralized system 245 to identify a similar issue(s) across testers and reduce time to correct the issues.

(5) The centralized system 245 applies a feedback from the joint analyses to one or more test cells 205-220 to change a testing schedule of semiconductor products being tested or to be tested. Alternatively, based on the joint analyses, the centralized system 245 manipulates a testing order of the semiconductor products. For example, if a local adaptive test engine associated with a test cell observes that semiconductor chips in certain locations of a semiconductor wafer have more defects than other chips in other locations, the centralized system 245 may modify a testing schedule on other test cells to identify a general pattern more quickly in order to detect an underlying manufacturing issue responsible for the defects.

(6) The centralized system 245 may also modify a schedule of semiconductor wafers/lots processed through the test cells 205-220 to make sure that the centralized system 245 observes and detects temporal trends or issues.

(7) The centralized system 245 may use different types of statistical analyses (i.e., analyses not used in the local adaptive test engines 225-240), e.g., by processing test results with the predictive modeling, result validation (i.e., validating or verifying the test results), and an online prediction. The online prediction refers to a sequential analysis. In the online prediction, there is an output, a prediction, and an observation repeated over and over again. The prediction associated with semiconductor products (or semiconductor product qualities) is based on the test results and is compared to the observation.

According to one embodiment, the centralized system 245 and/or one or more of the local adaptive test engines 225-240 includes IBM's stream computing middleware System S. The System S is described in detail in "System S-Stream Computing at IBM Research", IBM®, 2008, http://www-01.ibm.com/software/sw-library/en_US/detail/R924335M43279V91.html, wholly incorporated by reference as if set forth herein. The system S provides support for both several types of extensible stream data analytics as well as infrastructure mechanisms for collecting and parsing data streams from diverse sources, distributing, monitoring and managing analytics across distributed computing resources and their associated communications, as well as dealing with issues such as load-balancing and failure resilience. The failure resilience of System S is that if the System S hangs or shuts down, the System S is capable of coming back and resuming operations where it left off with little difficulty. Alternatively, if input data itself is irregular, System S can quickly handle or flush the input data to resume normal analysis function. The system S also provides support for multiple users, e.g., test engineers, to dynamically modify and incrementally deploy different types of analyses based on observations.

Figure 3A:
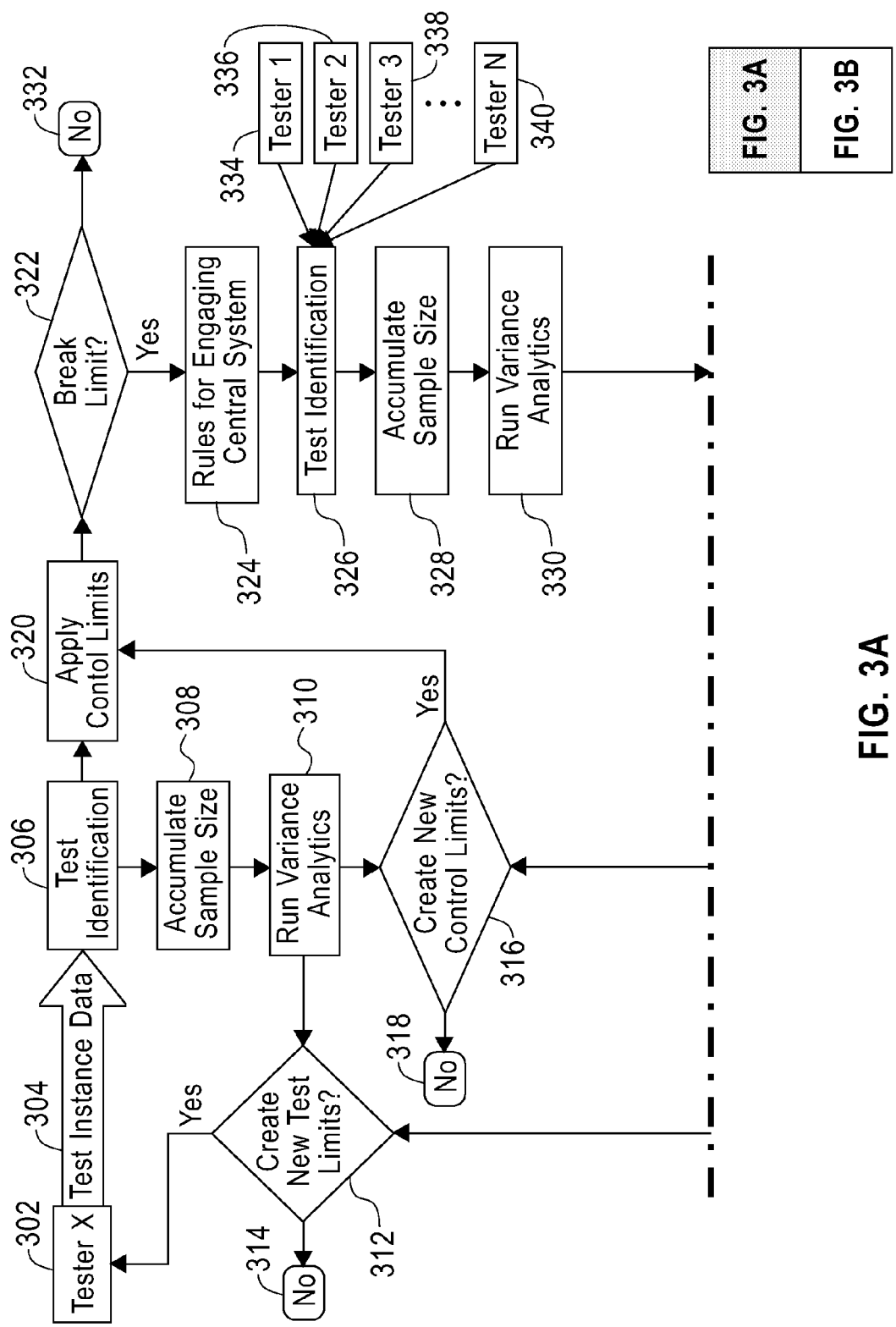
FIG. 3 illustrates a flow chart describing method steps for processing test results according to one embodiment of the present invention.
Figure 3B:
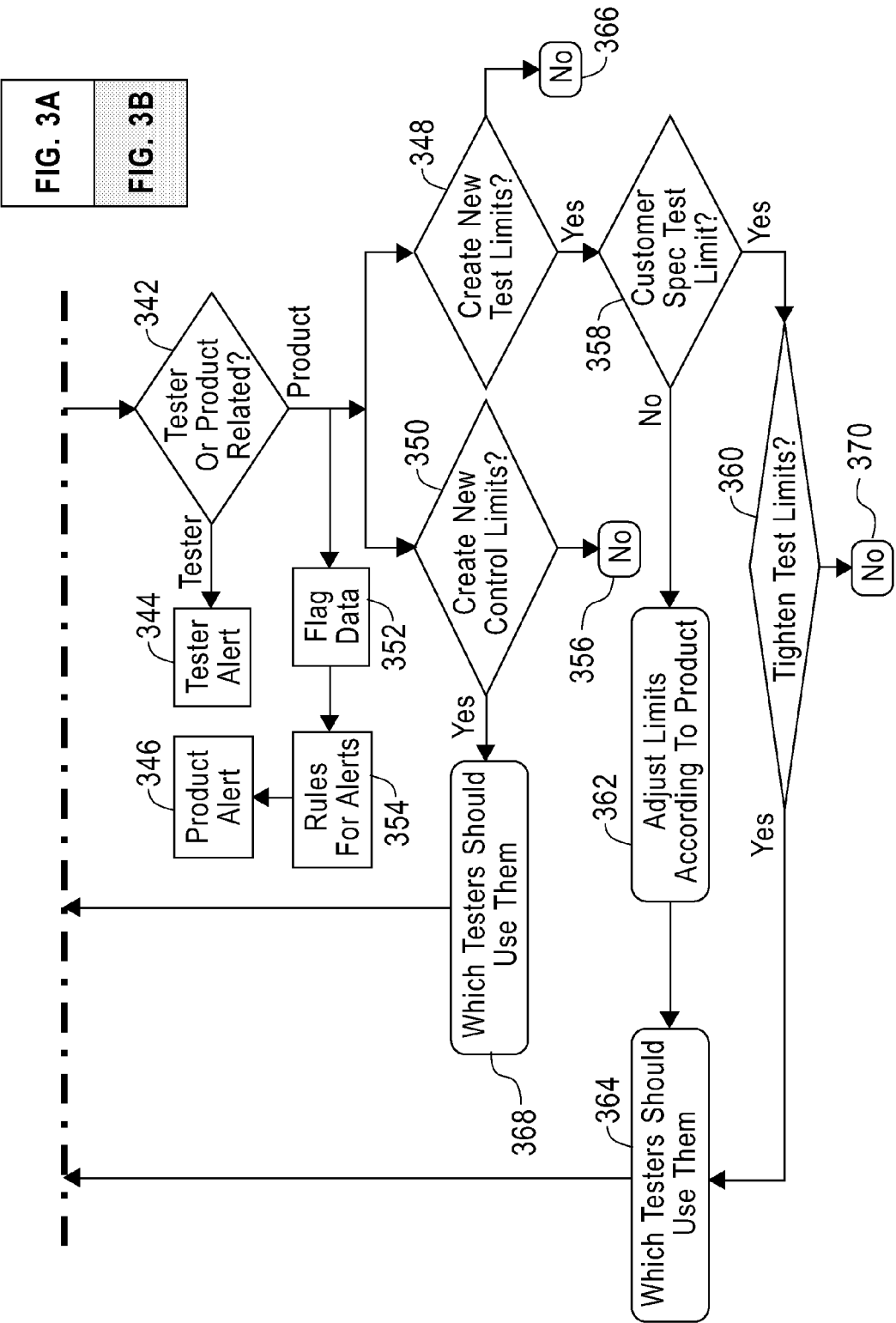

FIG. 3 illustrates a flow chart 300 including exemplary method steps run by the centralized system 245 and/or the local adaptive test engines 225-240 according to one embodiment of the present invention. In these method steps, the local adaptive test engines 225-240 analyzes parametric data that have test limits within which the test results may pass. Furthermore, in FIG. 3, the centralized system 245 or one or more of the local adaptive test engine 225-240 statistically calculates control limits from historical data (i.e., data stored in the data warehouse 105) for each parametric test (i.e., a test to estimate parameters from sample statistics) and uses the control limits to determine if the test results identify a semiconductor product as an outlier (i.e., a potentially defective product).

At step 302, a tester in a test cell sends data 304 (i.e., the test results and/or test instances) for each test to a corresponding local adaptive test engine. (A test instance refers to all the defined features of a test.) At step 306, the local adaptive test engine begins by identifying the test and retrieving all control information (e.g., information describing how the test is conducted and what the limits are) for that test. The control information includes, at least, the control limits for the test. After step 306, the control goes from steps 308 to step 320. At step 308, the local adaptive test engine stores that data 304 until the minimum number of results for a single test are available (user defines the minimum sample size). Upon having minimum sample of test results for any specific test, at step 310, the local adaptive test engine performs statistical analyses on the data 304. Based on the analyses of step 310, step 316 determines if the specific test's control limits should be changed to new control limits for the semiconductor product being tested. If not, at step 318, no action is taken at that time. If the control limits for the specific test are changed, at step 320, the new limits are created and made available for an application (e.g., a tester). At steps 320-322, the test result is compared to the (new) control limits to determine if a limit is exceeded. If the limit or threshold is not exceeded, at step 322, no action is taken. If a limit is exceeded, at step 322, outlier data is sent to the centralized system 245 for a further analysis.

Results from analytics in step 310 are also used to determine whether the test limits of the test (i.e., test result or test instance 304) should be adapted to the current product under the test (e.g., after evaluating a minimum sample size of test data, it is determined the test limits should be tighter to improve the quality of chips binned as "good"). If the test limits of the test needs not be adapted to the current product under the test, at step 314, no action is taken on the semiconductor product. Otherwise, the test limits of the test are adapted to the current product under the test and the control goes to step 302.

Before the centralized system 245 acts on data from step 322, specific rules of engagement must be met at step 324. These rules include any conditions that must be met before the centralized system 245 performs any analysis. The rules are defined by a user and at least includes, without limitation, 1) a criteria that identifies when the joint analyses is beneficial and will be performed (e.g., a very large number of outlier measures are being detected); and (2) there is correlation data available from other testers on any accessible test floor with the same test cell configurations. The correlation data includes, but is not limited to: semiconductor chip test data of the same product being concurrently tested (different wafers or modules of the same product) or having been recently tested (could be the same wafers or modules or different wafers or modules of the same product) on other testers, to compare test results; any semiconductor chip test data from the same tester cell configuration from which correlations and be extrapolated (e.g., evaluate pin fails as a correlation to tester channel fails across multiple testers and products); test environment conditions (e.g., mechanical operation metrics, such as temperature control, calibration information, hardware repair information, etc.).

Steps 326-330 perform a similar process as described for steps 306-310, except the test data 304 is now pulled from multiple testers to be accumulated and joined for analysis. The test data 304 may be tagged with the product code. Therefore, when concurrent test data is needed, the centralized system 245 can quickly identify which testers are testing the same product, or whether recently tested product is readily available in a data warehouse.

In one embodiment, each tester (e.g., a tester 1 (334), tester 2 (336), tester 3 (338), tester N (340)) has a unique identification. Test results generated by a tester may include the tester's identification and information of tests conducted. Thus, the centralized system 245 identifies a particular tester that detects the outliers and particular tests performed by the particular tester based on the test results. At step 328, the centralized system 245 may further accumulate the test results for one or more specific tests from a local adaptive test engine, or a tester, before running the joint analyses. At step 330, the centralized system 245 performs the joint analyses e.g., by comparing specific test results (from the tester in question) to test results from the same test collected at other testers. For example, the centralized system 245 compares test results of a test A from a tester 1 (334) to test results of the test A from other testers (testers 336-340).

If the centralized system 245 finds that a semiconductor product tested on a specific tester has anomalies in any test results or test environment conditions, as compared to other testers, that indicate a tester cell issue, at steps 342-344, the centralized system 245 initiates an alert and an action for the specific tester (e.g., if the thermal measure on product on one tester is consistently elevated compared to other testers, the proper personnel are notified and the tester is stopped until corrective action is taken). If the centralized system 245 finds that the product has a similar characteristic across all the testers, at steps 342 and 352, the centralized system 245 may determine that the product has experienced an overall electrical shift based on a variation in the fabrication process. The test results of the product may be flagged. That process shift may be minor (i.e., a minor process shift which does not affect performance of the product) or major (i.e., a major process shift which affects the performance of the product). If the process shift is major, at steps 354 and 346, the centralized system 245 initiates an alert for the product according to a rule or standard (e.g., X out of N samples exceed a specific limit) for initiating an alert. If the shift is minor, steps 348-350, the centralized system 245 may change the control limits to prevent these alerts from reoccurring and also change the test limits to better accommodate the product. In one embodiment, at step 350, the centralized system 245 evaluates whether a control limit change should be applied and, at step 368, to what extent, i.e., globally (all testers, 334-340) for this product, only specific testers from 334-340, or no change (356). At step 368, the centralized system 245 chooses which testers should use the changed control limits. At step 316, the centralized system 245 reports the changed or tightened test limits to the chosen testers for updating the control limits applied at step 320.

At step 358, the centralized system 245 evaluates whether the test limits are set according to customer specification. If the test limit is not a customer specification (e.g., test limit based on product characterization), at step 362, the centralized system 245 adjusts the test limits based on summary statistics obtained from the analyses. Otherwise, at step 360, the centralized system 245 may only tighten the test limits within the customer's specification. If the test limits should not be tightened, at step 370, no change is made. At step 364, the centralized system 245 chooses which testers should use the adjusted or tightened test limits. At step 312, the centralized system 245 reports the adjusted or tightened test limits to the chosen testers for updating their test limits.

Figure 4:
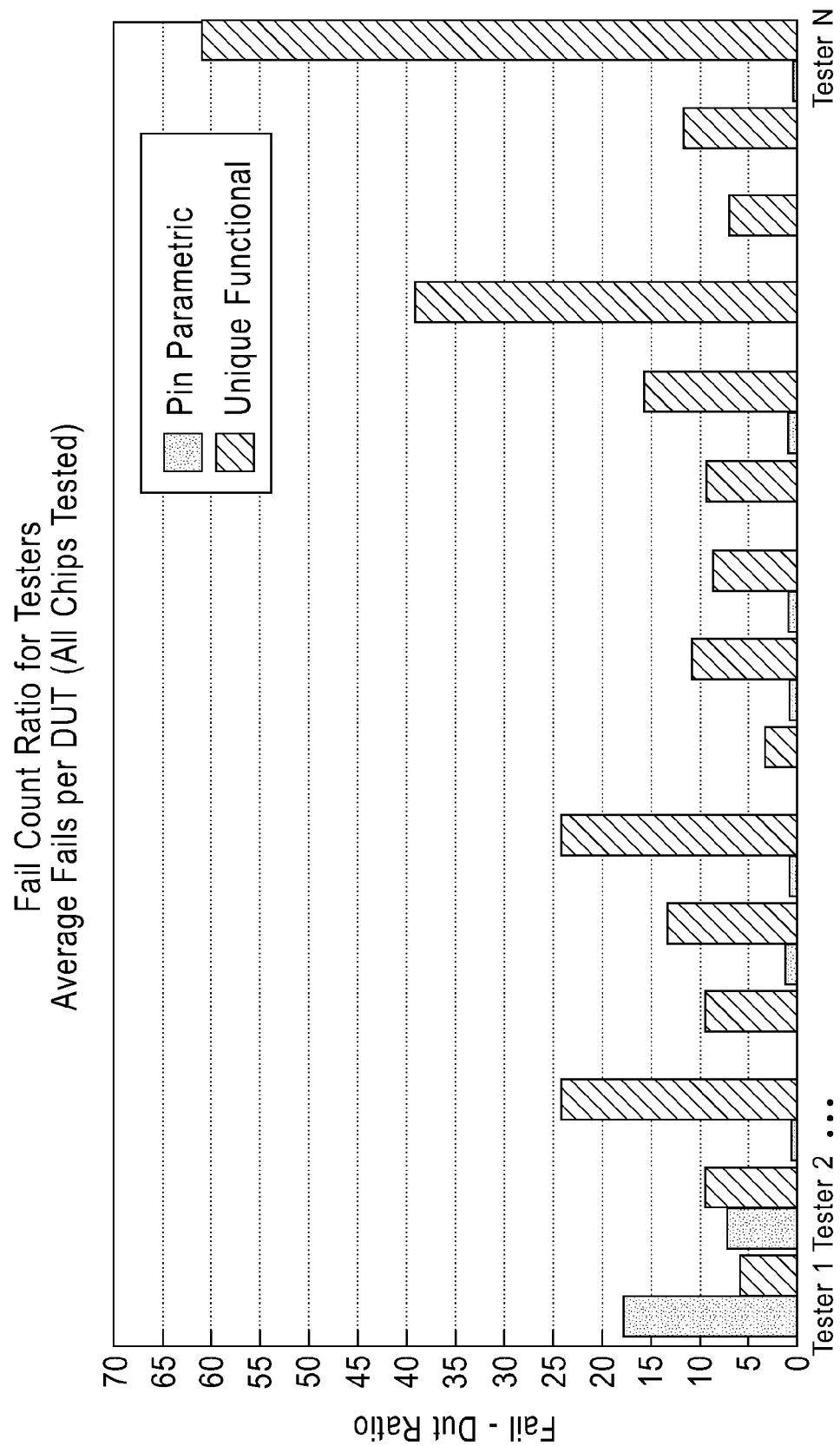
FIG. 4 illustrates a graph depicting failure count ratio for individual semiconductor testers according to one embodiment of the present invention.
Figure 5:
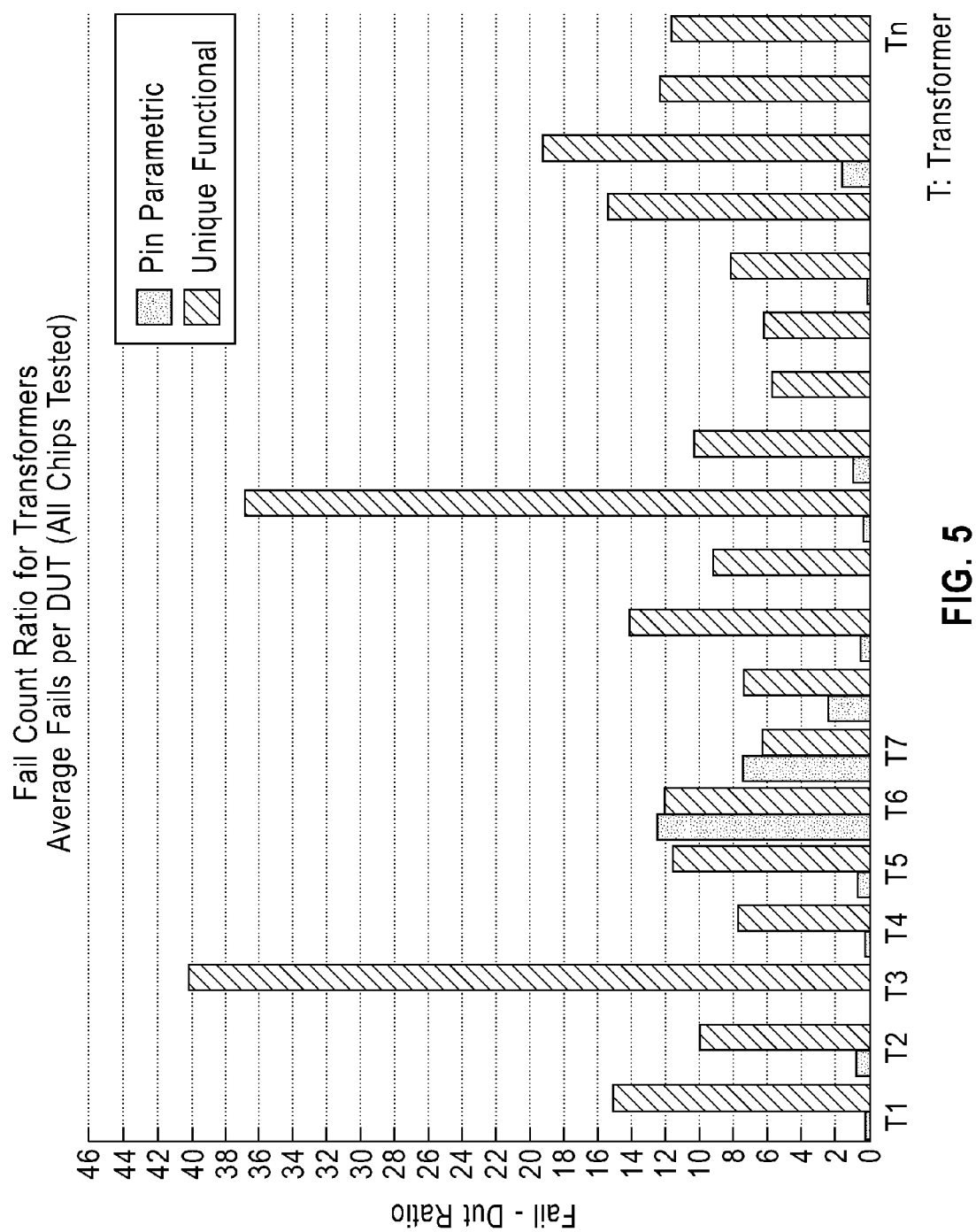
FIG. 5 illustrates a graph depicting failure count ratio for transformer according to one embodiment of the present invention.
Figure 6:
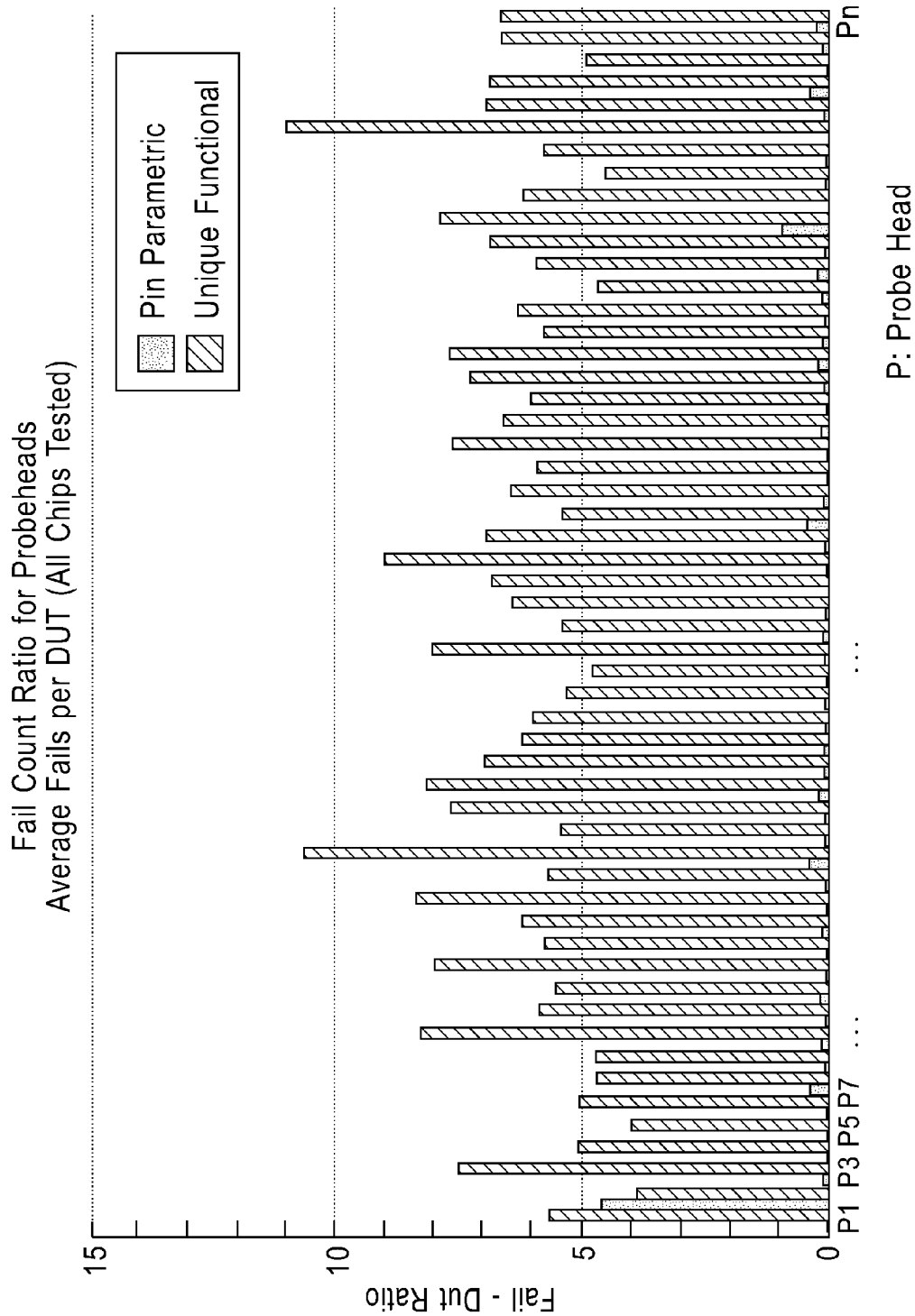
FIG. 6 illustrates a graph depicting failure count ratio for probe instruments according to one embodiment of the present invention.

FIGS. 4-6 illustrate exemplary tester/hardware statistics that can impact decisions/actions made in the centralized system 245 and/or local adaptive test engines 225-240. Each local adaptive test engine reports irregular statistics of test results conducted by a particular tester or test cell. FIG. 4 illustrates exemplary summary statistics for a single product tested across multiple testers. FIG. 4 illustrates failure ratio of each tester. For example, a pin parametric failure ratio of a tester 1 is 18% and functional failure ratio of the tester N is 61%. The pin parametric failure includes, but not limited to: a short circuit, an open circuit, indicating defective pins, defective pads, defective interconnects, etc. The function failure includes, but not limited to: logical failure, insufficient performance, etc. Based on FIG. 4, the centralized system 245 may identify testers 1, 2 and N as suspect because the testers 1 and 2 show highest pin parametric failure ratio and the tester N shows the highest functional failure ratio. In response, the centralized system 245 may perform the joint analyses on test results from the testers 1 through N, i.e., comparing the test results from the tester N to test results from other testers. The joint analyses are automatically performed by the centralized system 245. In FIG. 4, the average number of fails per DUT tested is displayed, and the number semiconductor products that failed was less than the number of semiconductor products tested.

FIG. 5 illustrates exemplary summary statistics for a single product's transformers. FIG. 5 illustrates failure ratio of each transformer. For example, a pin parametric failure ratio of transformers 6 and 7 are significantly higher than other transformers used for a single product. Based on data in FIG. 5, the centralized system in 245 may identify transformers 6 and 7 as being suspect. In response, the centralized system may perform joint analyses on test results from transformers 1 through N to compare transformers 6 and 7 to other the other transformers. The joint analyses are automatically performed by the centralized system 245. In FIG. 5, the average number of fails per DUT tested is displayed, and the number of failed semiconductor products was less than the number of semiconductor products tested.

FIG. 6 illustrates exemplary summary statistics for a single product's probe heads. FIG. 6 illustrates failure ratio of each probe head. For example, a pin parametric failure ratio of a probe head 2 is 4.7%, which is significantly higher then found with the other transformers. Based on data in FIG. 6, the centralized system 245 may point out that a probe head 2 is suspect. In response, the centralized system may perform the joint analyses on test results associated with the probe head 2, by comparing the test results of the probe head 2 to other test results of other probe heads. The joint analyses are automatically performed by the centralized system 245. In FIG. 6, the average number of fails per DUT tested is displayed, and the number semiconductor products that failed was less than the number of semiconductor products tested.

In one embodiment, the method step in FIG. 3 is implemented in hardware or reconfigurable hardware, e.g., FPGA (Field Programmable Gate Array) or CPLD (Complex Programmable Logic Device), using a hardware description language (Verilog, VHDL, Handel-C, or System C). In another embodiment, the method step in FIG. 3 is implemented in a semiconductor chip, e.g., ASIC (Application-Specific Integrated Circuit), using a semi-custom design methodology, i.e., designing a chip using standard cells and a hardware description language. Thus, the hardware, reconfigurable hardware or the semiconductor chip operates the method steps described in FIG. 3. In a further embodiment, one or more of the test cells 205-220 is implemented in hardware, e.g., FPGA, CPLD, or ASIC. One or more of the local adaptive test engines 225-240 is implemented in hardware, e.g., FPGA, CPLD, or ASIC. The centralized system 245 is also implemented in hardware, e.g., FPGA, CPLD, or ASIC.

FIG. 7 illustrates an exemplary hardware configuration of a computing system 700 running and/or implementing the method steps in FIG. 3. The computing system 700 implements one or more of: the test cells 205-220, the local adaptive test engines 225-240 and the centralized system 245. The hardware configuration preferably has at least one processor or central processing unit (CPU) 711. The CPUs 711 are interconnected via a system bus 712 to a random access memory (RAM) 714, read-only memory (ROM) 716, input/output (I/O) adapter 718 (for connecting peripheral devices such as disk units 721 and tape drives 740 to the bus 712), user interface adapter 722 (for connecting a keyboard 724, mouse 726, speaker 728, microphone 732, and/or other user interface device to the bus 712), a communication adapter 734 for connecting the system 700 to a data processing network, the Internet, an Intranet, a local area network (LAN), etc., and a display adapter 736 for connecting the bus 712 to a display device 738 and/or printer 739 (e.g., a digital printer of the like).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with a system, apparatus, or device running an instruction.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with a system, apparatus, or device running an instruction.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may run entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which run via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which run on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more operable instructions for implementing the specified logical function(s). It should also be noted that, in some alternative implementations, the functions noted in the block may occur out of the order noted in the figures. For example, two blocks shown in succession may, in fact, be run substantially concurrently, or the blocks may sometimes be run in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A computer-implemented apparatus for processing test results from a plurality of individual semiconductor testing systems for testing a semiconductor product, the system comprising:
   a memory device; and
   a processor unit in communication with the memory device, the processor unit performs steps of:
   receiving the test results from the plurality of individual semiconductor testing systems, a testing system comprising: a semiconductor tester, a transformer and a probe card;
   analyzing each test result at a local adaptive test engine corresponding to an individual semiconductor testing system;
   jointly analyzing a plurality of the test results from the plurality of individual semiconductor testing systems, the jointly analyzing the plurality of the test results including: comparing the test results to determine whether a particular testing system causes one or more issues, to determine whether a particular testing system component causes the one or more issues, and to determine whether a particular semiconductor product causes the one or more issues, the one or more issues including: a test environmental issue, a testing system variability issue, a testing system calibration issue, a product variability issue, and a manufacturing process variability issue, a testing system component variability issue, a testing system component calibration issue;
   based on the determinations of the one or more issues, interchanging a plurality of testing system components between the plurality of testing systems; and
   running one or more tests on the plurality of testing systems after the interchanging.

2. The computer-implemented apparatus according to claim 1, wherein the test environmental issue is one or more of: a hardware issue, an electrical issue, a mechanical issue and a maintenance issue.

3. The computer-implemented apparatus according to claim 2, wherein the hardware issue includes a specific pin failure on one or more of the semiconductor products.

4. The computer-implemented apparatus according to claim 2, wherein the electrical issue includes unstable power supplies and temperature control units in the plurality of individual semiconductor testers.

5. The computer-implemented apparatus according to claim 2, wherein the electrical issue is detected by one or more of: analyzing electrical parameters involving a scan load or unload, core test or performance sort ring oscillator (PSRO), or by measuring a current drain, voltage drain or power drain on power supplies in the plurality of individual semiconductor testing systems, or performing logic tests by capturing at least one clock signal on the semiconductor products.

6. The computer-implemented apparatus according to claim 2, wherein the mechanical issue is detected by testing a physical module or performing a wafer test.

7. The computer-implemented apparatus according to claim 1, wherein the determining comprises: comparing the test results of the semiconductor product tested across the individual semiconductor testing systems.

8. The computer-implemented apparatus according to claim 1, wherein the processor further performs: changing a testing schedule of the semiconductor products on said each individual semiconductor testing system according to the determined cause.

9. The computer-implemented apparatus according to claim 1, wherein the testing system calibration issue includes a skew in pin signal delays from a DUT (Device under test) to a testing system.

10. The computer-implemented apparatus according to claim 1, wherein the product variability issue is used for a semiconductor technology transition.

11. The computer-implemented apparatus according to claim 1, wherein the manufacturing processing variability issue is detected by correlating the test results with data from inline tests.

12. The computer-implemented apparatus according to claim 1, wherein the processor unit further performs:
   determining whether one or more of the plurality of individual semiconductor testing systems causes the one or more of the identified issues or whether semiconductor products tested by the plurality of individual semiconductor testing systems causes the one or more of the identified issues.

13. A computer program product for processing test results from a plurality of individual semiconductor testing systems, the computer program product comprising:
   a computer readable non-transitory storage medium having computer readable program code embodied therewith, the computer readable program code when operated by a processor causes it to perform the steps of:
   receiving the test results from the plurality of individual semiconductor systems, a testing system comprising: a semiconductor tester, a transformer and a probe card;
   analyzing each test result at a local adaptive test engine corresponding to an individual semiconductor testing system;
   jointly analyzing a plurality of the test results from the plurality of individual semiconductor testing systems, the jointly analyzing the plurality of the test results including: comparing the test results to determine whether a particular testing system causes one or more issues, to determine whether a particular testing system component causes the one or more issues, and to determine whether a particular semiconductor product causes the one or more issues, the one or more issues including: a test environmental issue, a testing system variability issue, a testing system calibration issue, a product variability issue, and a manufacturing process variability issue, a testing system component variability issue, a testing system component calibration issue;
   based on the determinations, interchanging a plurality of testing system components between the plurality of testing systems; and
   running one or more tests on the plurality of testing systems after the interchanging.

14. The computer program product according to claim 13, wherein the determining comprises comparing the test results of the semiconductor product tested across the individual semiconductor testing systems.

\* \* \* \* \*